United States Patent [19]
Daniele et al.

[11] Patent Number: 4,587,717
[45] Date of Patent: May 13, 1986

[54] LED PRINTING ARRAY FABRICATION METHOD

[75] Inventors: Joseph J. Daniele, Pittsford; Mehdi N. Araghi, Webster, both of N.Y.

[73] Assignee: Xerox Corporation, Stamford, Conn.

[21] Appl. No.: 729,707

[22] Filed: May 2, 1985

[51] Int. Cl.$^4$ ............................................. H01L 7/36
[52] U.S. Cl. .............................. 29/569 L; 29/576 B; 148/1.5; 148/175
[58] Field of Search ................... 29/569 L, 576 B; 148/1.5, 175

[56] References Cited

U.S. PATENT DOCUMENTS

| | | | |
|---|---|---|---|
| 4,211,586 | 7/1980 | Fang et al. | 148/175 |
| 4,280,273 | 7/1981 | Vincent | 29/569 L |
| 4,335,501 | 6/1982 | Wickenden et al. | 29/569 L |
| 4,455,562 | 6/1984 | Dolan et al. | 346/154 |

OTHER PUBLICATIONS

Pickar et al., IBM-TDB, 16(10) (1974) p. 3200.

Primary Examiner—Upendra Roy
Attorney, Agent, or Firm—Frederick E. McMullen

[57] ABSTRACT

The method of fabricating Light Emitting Diodes (LEDs) with supporting circuits on a silicon chip or wafer for a Full Width Array (FWA) in which the silicon substrate or chip is first coated with Silicon Dioxide to form a thin film layer, a plurality of holes corresponding in number and configuration to the desired array are next opened in the layer, Gallium Phosphide LEDs together with p-n junctions and contact layers are then grown epitaxially in the holes, and finally attendant LED operating circuits are epitaxially formed on the silicon chip together with operative connections to the individual LEDs by Integrated Circuit techniques.

10 Claims, 5 Drawing Figures

LED PRINTING ARRAY FABRICATION METHOD

The invention relates to LED arrays, and more particularly, to a method of fabricating an LED array which may be combined with other like LED arrays to form a full width image write bar.

The use of an array of Light Emitting Diodes (LEDs) to write images on a recording member such as the photoreceptor of a xerographic type imaging system has taken on renewed interest with the current day interest in electronic image printers and the increased LED efficiencies obtained with Gallium Arsenide (GaAs) as LED substrates. As will be understood, LED arrays typically comprise one or more linear rows of LEDs in close juxtaposition with one another on a single chip or substrate. In electronic printer applications, the individual LEDs of the array are actuated in accordance with an image signal input. The resulting image rays created by the LEDs, which are focused onto the photoreceptor, create or write a latent electrostatic image on the photoreceptor as the photoreceptor is moved in synchronism therewith. Following this, the latent electrostatic image is developed, transferred to a suitable copy substrate material such as a copy sheet, and thereafter fused or fixed to provide a permanent copy.

However, the number of LEDs that can be packed onto a single chip or wafer is limited, and this, in turn, limits the image resolution that can be achieved with a single LED array. Joining several of the smaller LED arrays together to form a longer array, and particularly, to form a full length array with increased resolution along with the attendant simplification of the printer optical system that this allows is desirable.

A primary limitation on resolution and density of a full page width LED array is the need to wire each individual LED to an off-chip driver circuit. Much higher resolution and lower cost can be achieved if the drive circuitry can be on the same chip as the LED. This would eliminate much of the hybrid wiring normally required. Moreover, if these self-driving chips could be accurately cute and butted to form a continuous single line LED array, this would eliminate expensive optical or electronic stitching methods.

However, since III-IV class LED materials such as GaP and GaAs, when used as substrates, are easily damaged by saw cutting, etc., LED chips or arrays cannot normally be effectively butted together but instead must be staggered in two rows and then optically interlaced with rather complex and relatively expensive optical means such as a pair of gradient index fiber lenses. Moreover, present state-of-the-art greatly limits the use of on-chip circuitry on III-V materials.

The present invention allows an LED array of GaP or other suitable LED material to be formed on a silicon substrate, which can be cut and butted without excessive damage. On this same substrate drive and addressing circuitry is formed by CMOS, NMOS or bipolar integrated circuit processing techniques in the silicon and the LEDs are wired directly to the circuitry in a final mask step. In this way, the chips bearing both LEDs and drive circuitry are made of silicon and can be cut and accurately butted by known techniques to form a low cost, high resolution Full Width LED array.

The invention relates to a method for fabricating a high speed, high resolution LED array for printing images, comprising the steps of: coating one surface of a silicon chip with Silicon Dioxide to form a thin film layer; opening an array of holes of predetermined size and pattern in the layer; growing Gallium Phosphide Light Emitting Diodes including p-n junctions and contact layers in the holes; and fabricating control circuitry for the Diodes on the remainder of the chip.

IN THE DRAWINGS

Figure 1:
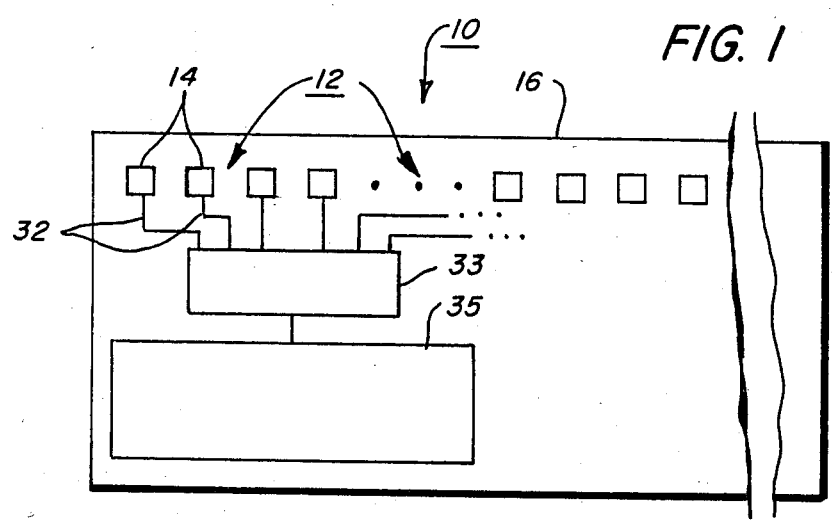
FIG. 1 is a top view of a surface emitting type LED chip fabricated in accordance with the teachings of the present invention.
Figure 2:
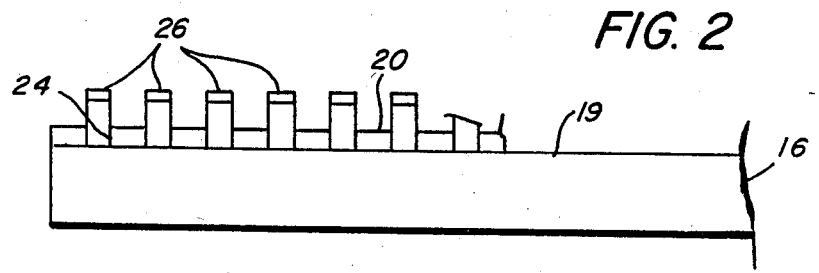
FIG. 2 is a side view in cross section of the LED chip shown in FIG. 1.
Figure 3:
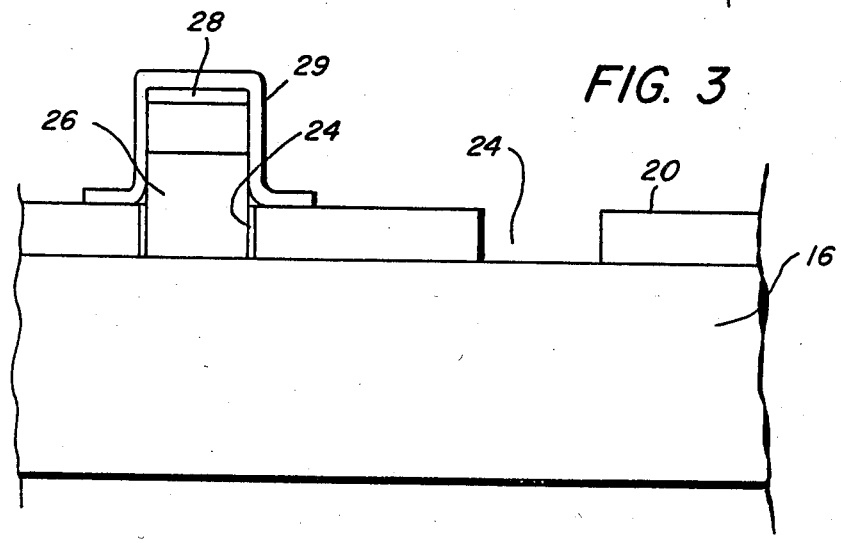
FIG. 3 is an enlarged side view in cross section showing details of a GaP LED chip fabricated on an $SiO_2$ coated silicon substrate in accordance with the teachings of the present invention.

Referring to the drawings, there is shown the solid state full width write bar, designated generally by the numeral 10, of the present invention. Write bar 10 has at least one linear array 12 of Light Emitting Diodes (LEDs) 14. In the exemplary arrangement described herein, write bar 10 is used to write, either directly or through suitable lens means, images on a moving recording member such as a previously charged photoreceptor (not shown) of a xerographic system through selective actuation of the individual LEDs 14 in the array 12 in accordance with an image signal or pixel input. For this purpose, the array 12 of LEDs 14 has an overall length equal to or slightly greater than the effective width of the photoreceptor. Ordinarily, write bar 10 is disposed at right angles to the direction of photoreceptor movement and in predetermined spaced relation to the surface of the photoreceptor as will be understood by those skilled in the art. As a result, write bar 10 writes, i.e. exposes, the photoreceptor a line at a time as the photoreceptor moves therepast to create a latent electrostatic image represented by the image signal input to write bar 10.

Following writing of the image on the photoreceptor by write bar 10, the latent electrostatic image created on the photoreceptor by LED write bar 10 is developed and transferred to a suitable copy substrate material such as a copy sheet. The copy sheet bearing the transferred image is thereafter fused or fixed to render the copy permanent while the photoreceptor is cleaned in preparation for recharging.

Figure 4:
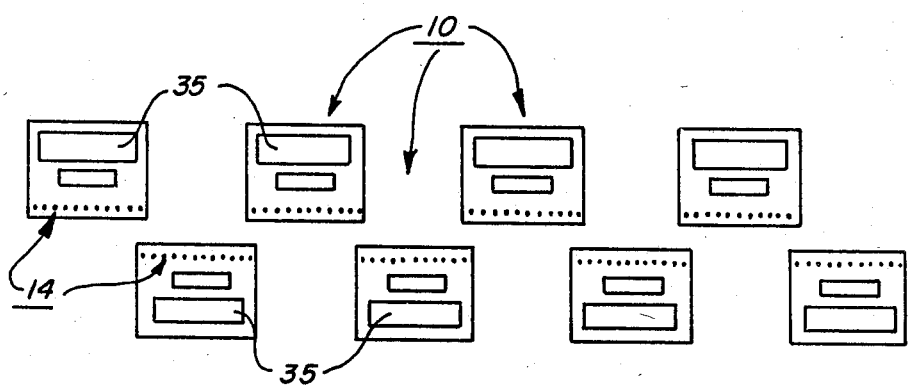
FIG. 4 is a view illustrating a plurality of LED chips assembled together in staggered fashion to form a full width write bar.
Figure 5:
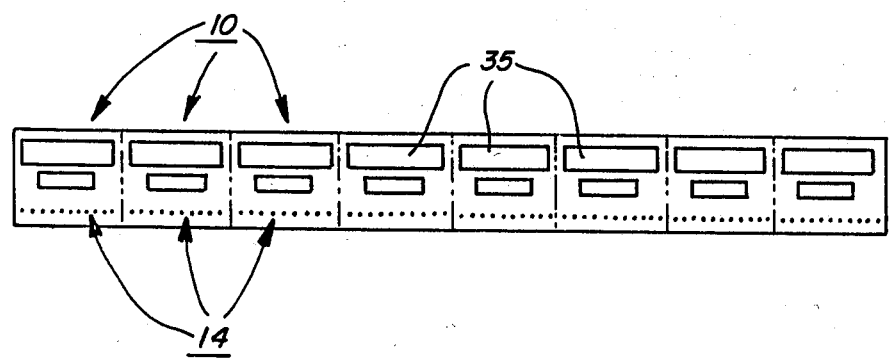
FIG. 5 is a view illustrating a plurality of LED chips butted together end to end to form a full width write bar.

Write bar 10 is formed from a plurality of generally rectangular substrates or chips 16 separated as by sawing or other suitable means from one or more circular silicon wafers (not shown). Chips 16 may be assembled in the staggered relationship as shown in FIG. 4 or butted end to end as shown in FIG. 5 to form a write bar of desired length. Where chips 16 are disposed in staggered fashion as shown in FIG. 4, the chips may, for example, be operatively joined or stitched together by suitable electrical circuitry effective to crossover from one chip to the next when writing an image line without loss or distortion of the image at the chip junctions. Alternately, chips 16 may be optically joined or stitched together to in effect remove the stagger and align the images produced by each chip at the recording member without loss or distortion of the image at the junctions between chips. Where a plurality of chips 16 are arranged in end to end relation as shown in FIG. 5, the chips, following alignment with one another, are joined together by suitable means to provide a write bar 10 of desired length.

The top or upper surface 19 of chip 16 is coated with a thin film layer 20 of Silicon Dioxide ($SiO_2$) for example. An array of holes 24 are next opened in layer 20, holes 24 being of a predetermined size, spacing, and orientation to provide an array 12 of desired size and resolution. Holes 24 may be formed photolithographically by placing a photo-mask of appropriate configuration (not shown) over layer 20 and applying a suitable etch to remove the layer 20 at the point where holes 24 are desired.

Following formation of holes 24, Gallium Phosphide (GaP) LED structures 26 are grown in each of the holes 24, preferably by Chemical Vapor Deposition (CVD). Concurrently, p-n junctions 28 and electrical contact layers 29 are grown with each layer of the GaP LED structure 26. Other growing techniques may be employed instead, such as Molecular Beam Epitaxy (MBE), Liquid Phase Epitaxy (LPE), or Metalorganic Chemical Vapor Deposition.

Following the formation of the GaP LED structures 26, LED contacts 32 and other supporting circuitry such as a suitable fanout or distributing circuit 33 and a signal processing circuitry 35 are fabricated on chip 16 using conventional silicon Integrated Circuit (IC) techniques. Fanout circuit 33 provides image signals to the chips of write bar 10, either in parallel to the chips or serially to all chips of bar 10 in a preset sequence, or in a suitable serial/parallel combination. Since the GaP LED structures 26 are relatively high temperature materials, the IC processing, which is normally at a lower temperature, has no adverse effect on the previously formed LED structures. A $Si_3N_4$ temporary protective coating may be placed over the GaP structure to minimize adverse effects during IC processing.

GaP based LED structures are preferable in view of GaP's epitaxial match and compatibility with silicon. And since GaP comprises a binary material, GaP provides relative simplicity in growth while being capable of providing the highest efficiency indirect gap visible red LEDs. Further, GaP is capable of making yellow or green LEDs although the efficiency of the yellow or green LEDs formed is somewhat lower. Further advantages include the elimination of a hybrid interconnects and separate drive chips; the use of a relatively low cost silicone substrate rather than the high cost GaP or GaAs substrates with the economies of scale associated with the use of 6" diameter silicon wafers rather than 2" diameter Gap or 3" diameter GaAs wafers and the use of the advanced manufacturing process and equipment available for silicon; and the fact that the cutting and butting techniques presently available for forming silicon light sensor arrays can be readily used to form LED arrays. And, employing the currently most economical crystalline substrate material, silicon, allows utilization and coordination of silicon monolithic and mosaic (E.P.C.C.) technologies in the fabrication of write bars 10.

While write bar 10 is shown and described as having a silicon substrate with GaP LED structures, other substrate materials such as Gallium Arsenide (GaAs) may instead be used. Where GaAs is used as the substrate, GaAs integrated circuits are provided and Gallium Arsenide Phosphide [Ga(AsP)], or Gallium Aluminum Arsenide [(Ga, Al)As], or other lattice matched LEDs used, and these can operate in the visible or near infra-red.

While the invention has been described with reference to the structure disclosed, it is not confined to the details set forth, but is intended to cover such modifications or changes as may come within the scope of the following claims.

We claim:

1. A method for forming a Light Emitting Diode (LED) for combination with one or more like LEDs to form a solid state Full Width Array (FWA) Light Emitting Diode (LED) write bar, comprising the steps of:
    (a) coating one surface of a silicon chip with Silicon Dioxide to form a thin film layer;
    (b) opening an array of holes of predetermined size and pattern in said layer;
    (c) growing Gallium Phosphide (GaP) LEDs including p-n junctions and contact layer in said holes; and
    (d) fabricating control circuitry for said LEDs on the remainder of said chip.

2. The method of forming a Light Emitting Diode (LED) for assembly with at least one other like LED to form a solid state Full Width Array of Light Emitting Diodes (LEDs) for scanning a recording member and printing images on the recording member in response to an image signal input, comprising the steps of:
    (a) coating one surface of a substrate so as to form a thin film insulating layer;
    (b) photolithographically forming a row of closely spaced holes in said thin film layer, said row extending widthwise along said substrate from end to end;
    (c) growing an LED in each of said holes;
    (d) forming circuit means for supporting operation of said LEDs on an unused area of said substrate; and
    (e) forming electrical contacts between each of said LEDs and said circuit means.

3. The method according to claim 2 including the step of forming said thin film layer on a silicon substrate.

4. The method according to claim 2 including the step of forming said thin film layer on a gallium arsenide substrate.

5. The method according to claim 2 including the step of forming said thin layer with silicon dioxide.

6. The method according to claim 2 including the step of forming a fanout circuit for coupling individual ones of said LEDs with said circuit means.

7. The method according to claim 2 of protecting said LED while forming said circuit means by covering said LED with a protective coating.

8. The method according to claim 3 including the step of growing gallium phosphide LEDs in said holes.

9. The method according to claim 4 including the step of growing gallium arsenide phosphide LEDs in said holes.

10. The method according to claim 4 including the step of growing gallium aluminum arsenide LEDs in the said holes.

* * * * *